United States Patent
Nemer et al.

(10) Patent No.: US 7,280,619 B2
(45) Date of Patent: Oct. 9, 2007

(54) METHOD AND APPARATUS FOR COMPENSATING I/Q IMBALANCE IN RECEIVERS

(75) Inventors: Elias Nemer, San Jose, CA (US); Ahmed Said, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 715 days.

(21) Appl. No.: 10/746,550

(22) Filed: Dec. 23, 2003

(65) Prior Publication Data

US 2005/0135521 A1 Jun. 23, 2005

(51) Int. Cl.
*H03D 3/00* (2006.01)
*H03D 1/04* (2006.01)
*H04B 1/00* (2006.01)
*H04B 15/00* (2006.01)
*H03K 5/159* (2006.01)

(52) U.S. Cl. ............... 375/323; 375/350; 375/235; 375/285; 375/346

(58) Field of Classification Search .......... 375/235, 375/285, 346, 316, 350, 323
See application file for complete search history.

(56) References Cited

U.S. PATENT DOCUMENTS

| | | | |
|---|---|---|---|
| 4,085,378 A * | 4/1978 | Ryan et al. ............... 329/308 |
| 5,263,196 A * | 11/1993 | Jasper ...................... 455/324 |
| 5,705,949 A * | 1/1998 | Alelyunas et al. ......... 329/304 |
| 5,949,821 A * | 9/1999 | Emami et al. ............ 375/235 |
| 6,044,112 A * | 3/2000 | Koslov ..................... 375/235 |
| 6,122,325 A * | 9/2000 | Mogre et al. ............. 375/261 |
| 6,744,829 B1 * | 6/2004 | Mohindra .................. 375/343 |
| 6,765,623 B1 * | 7/2004 | Parker ...................... 348/607 |
| 6,895,045 B2 * | 5/2005 | Ozluturk et al. .......... 375/235 |
| 7,035,341 B2 * | 4/2006 | Mohindra .................. 375/261 |
| 7,061,994 B2 * | 6/2006 | Li et al. .................... 375/316 |
| 7,123,896 B2 * | 10/2006 | Chiu ......................... 455/313 |
| 2002/0097812 A1 * | 7/2002 | Wiss ......................... 375/316 |
| 2005/0135521 A1 * | 6/2005 | Nemer et al. ............. 375/350 |

FOREIGN PATENT DOCUMENTS

| | | |
|---|---|---|
| WO | WO 00/44143 | 7/2000 |
| WO | WO 01/08292 A1 | 2/2001 |
| WO | PCT/US2004/041908 | 4/2005 |

\* cited by examiner

*Primary Examiner*—Mohammed Ghayour
*Assistant Examiner*—Nurul M Matin
(74) *Attorney, Agent, or Firm*—Blakely, Sokoloff, Taylor & Zafman LLP

(57) ABSTRACT

A method and apparatus for compensating I/Q imbalance in receivers is described. The method includes determining a difference between energies of two quadratures, correcting an amplitude imbalance using the difference between the energies of two quadratures, determining a cross-correlation between the two quadratures, and correcting a phase imbalance using the cross-correlation between the two quadratures.

10 Claims, 5 Drawing Sheets

METHOD AND APPARATUS FOR COMPENSATING I/Q IMBALANCE IN RECEIVERS

BACKGROUND

1. Technical Field

Embodiments of the invention relate to the field of digital compensation in receivers, and more specifically to compensating I/Q imbalance in receivers.

2. Background Information and Description of Related Art

In digital video broadcast systems, such as those used in terrestrial or satellite transmission (DVB-S and DVB-T), a tuner is used at the end-user site to down-convert the signal in frequency and to provide a first stage of demodulation that yields the baseband quadratures (I and Q components). Due to imperfect analog demodulation, the two quadratures will be off-balance in both phase and amplitude.

This in turn has an adverse effect on the receiver performance in that it causes a distortion of the shape of the QAM/PSK constellation, which results in larger cluster variance and higher bit error rate, and it prevents the proper operation and convergence stability of some of the internal loops of the receiver (for example, the decision directed equalization and phase lock loop).

BRIEF DESCRIPTION OF DRAWINGS

The invention may best be understood by referring to the following description and accompanying drawings that are used to illustrate embodiments of the invention. In the drawings.

DETAILED DESCRIPTION

Embodiments of a method and apparatus for compensating I/Q imbalance in receivers are described. In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
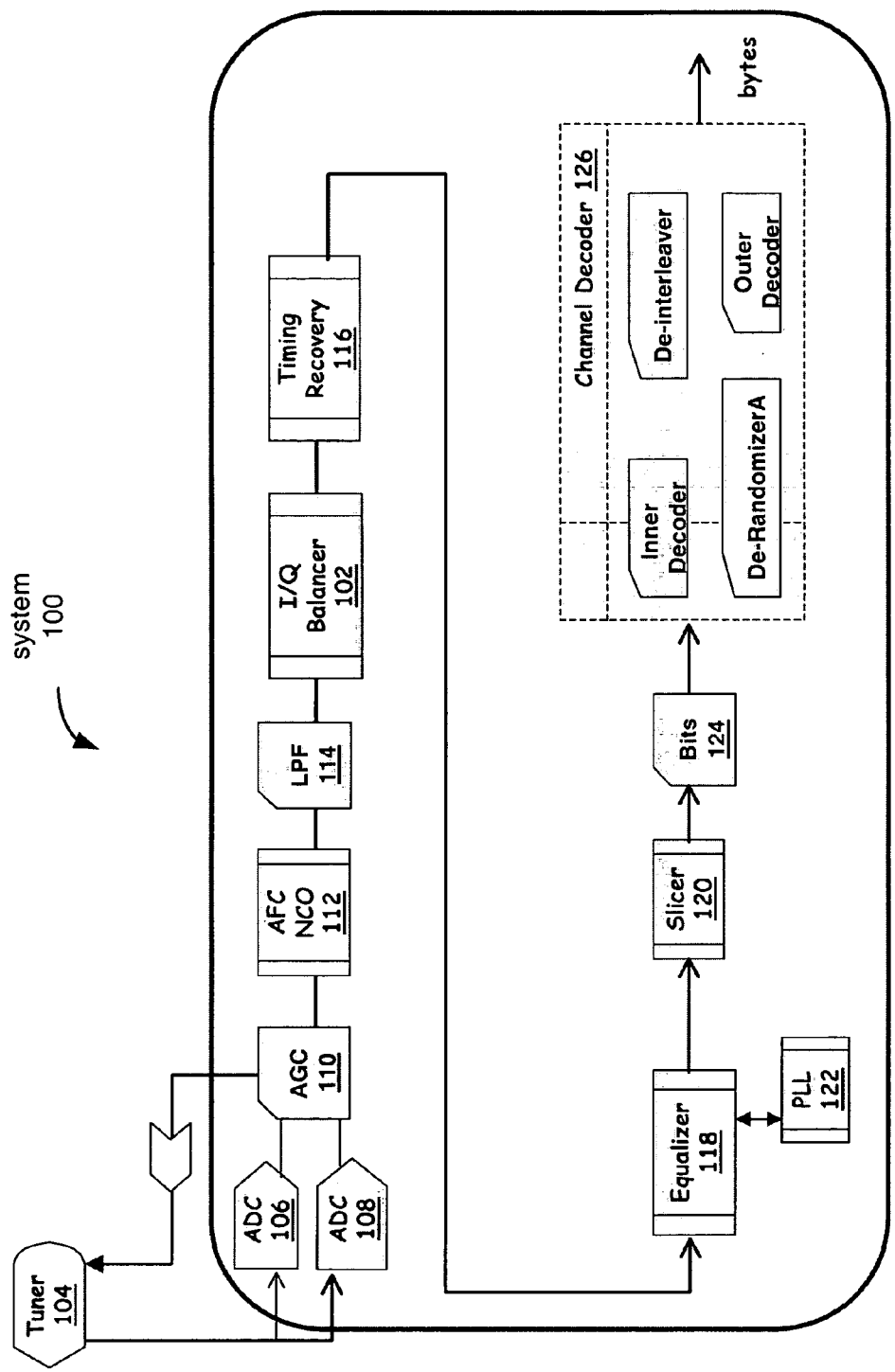
FIG. 1 is a block diagram illustrating one generalized embodiment of a system incorporating the invention.

Referring to FIG. 1, a block diagram illustrates a system 100 according to one embodiment of the invention. Those of ordinary skill in the art will appreciate that the system 100 may include more components than those shown in FIG. 1. However, it is not necessary that all of these generally conventional components be shown in order to disclose an illustrative embodiment for practicing the invention.

System 100 includes a tuner 104 to down-convert received signals in frequency and to demodulate the signals into baseband quadratures. In one embodiment, the baseband quadratures comprise I and Q components. Due to imperfect analog modulation/demodulation processes or for other reasons, the quadratures may be off-balance in both amplitude and phase. An I/Q balancer 102 corrects the amplitude and phase imbalance of the quadratures. The system 100 also includes one or more analog-to-digital converters (ADC), such as 106 or 108, to convert received analog signals to digital signals, and an automatic gain control element (AGC) 110 to control the input energy to the system 100 by controlling the gain of the tuner. Other components of the system may include a numerically controlled oscillator (NCO) 112, a low-pass filter (LPF) 114, a timing recovery block 116, an equalizer 118, a slicer 120 outputting bits 124, a phase lock loop (PLL) 122, and a channel decoder 126.

Figure 2:
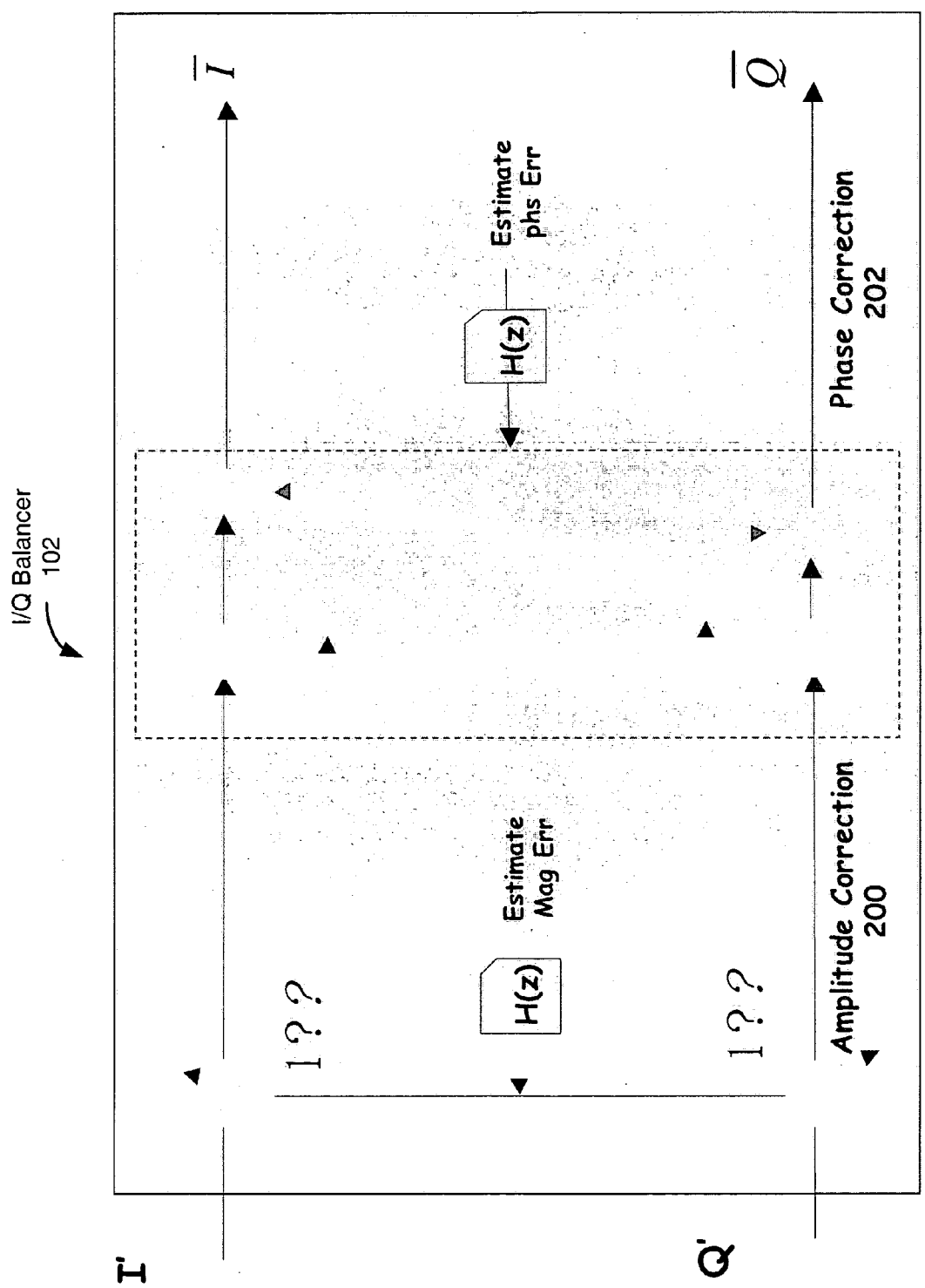
FIG. 2 is a block diagram illustrating an I/Q balancer according to an embodiment of the invention.

FIG. 2 illustrates an I/Q balancer 102 according to one embodiment of the invention. The I/Q balancer 102 includes an amplitude correction block 200 to correct the amplitude imbalance of the baseband quadratures and a phase correction block 202 to correct the phase imbalance of the baseband quadratures. The exact expressions for the phase and magnitude imbalance of the I/Q baseband quadratures may be shown to be as follows, with I' and Q' representing the corrupted I and Q components, and E denoting statistical expectation:

phase imbalance $\Delta\theta = \sin^{-1}(R_1)$, where $$R_1 = \frac{E[I' \cdot Q']}{\sqrt{E[I'^2]E[Q'^2]}}$$

magnitude imbalance $$\varepsilon = \frac{R_2 - 1}{1 + R_2}, \text{ where } R_2 = \sqrt{\frac{E[I'^2]}{E[Q'^2]}}.$$

To avoid division, the magnitude imbalance may be estimated as a normalized difference between the energies of the quadratures instead of a ratio. Thus, the magnitude imbalance may be approximated as follows:

$$\varepsilon \approx \frac{R}{2}, \text{ where } R = \{E[I'^2] - E[Q'^2]\} \times \frac{1}{E_S^2}.$$

That is, the magnitude imbalance is approximated as the difference of the energies of the quadratures multiplied by a normalization factor of $1/E_S^2$. The normalization factor is the inverse of the energy of the input signal, denoted by $E_S^2$ and represents the sum of the energies of both quadratures, i.e. $E_S^2 = E[I'^2] + E[Q'^2]$. $E_S^2$ may be obtained from the automatic gain control element (AGC) 110, which maintains the total input energy at a preset target value. After the estimated magnitude imbalance, $\epsilon$, is determined, the imbalance may be corrected by multiplying the quadratures by $(1-\epsilon)$ and $(1+\epsilon)$, respectively.

The phase imbalance may be approximated as follows using the cross-correlation:

$$\Delta\theta \approx \arcsin(2*Rp) \text{ or}$$

$$\Delta\theta \approx 2*Rp, \text{ where}$$

$$Rp = E[I' \cdot Q'] \times \frac{1}{E_S^2}.$$

That is, the phase imbalance is approximated as the cross-correlation of the quadratures multiplied by the normalization factor of $1/E_S^2$.

Figure 3:
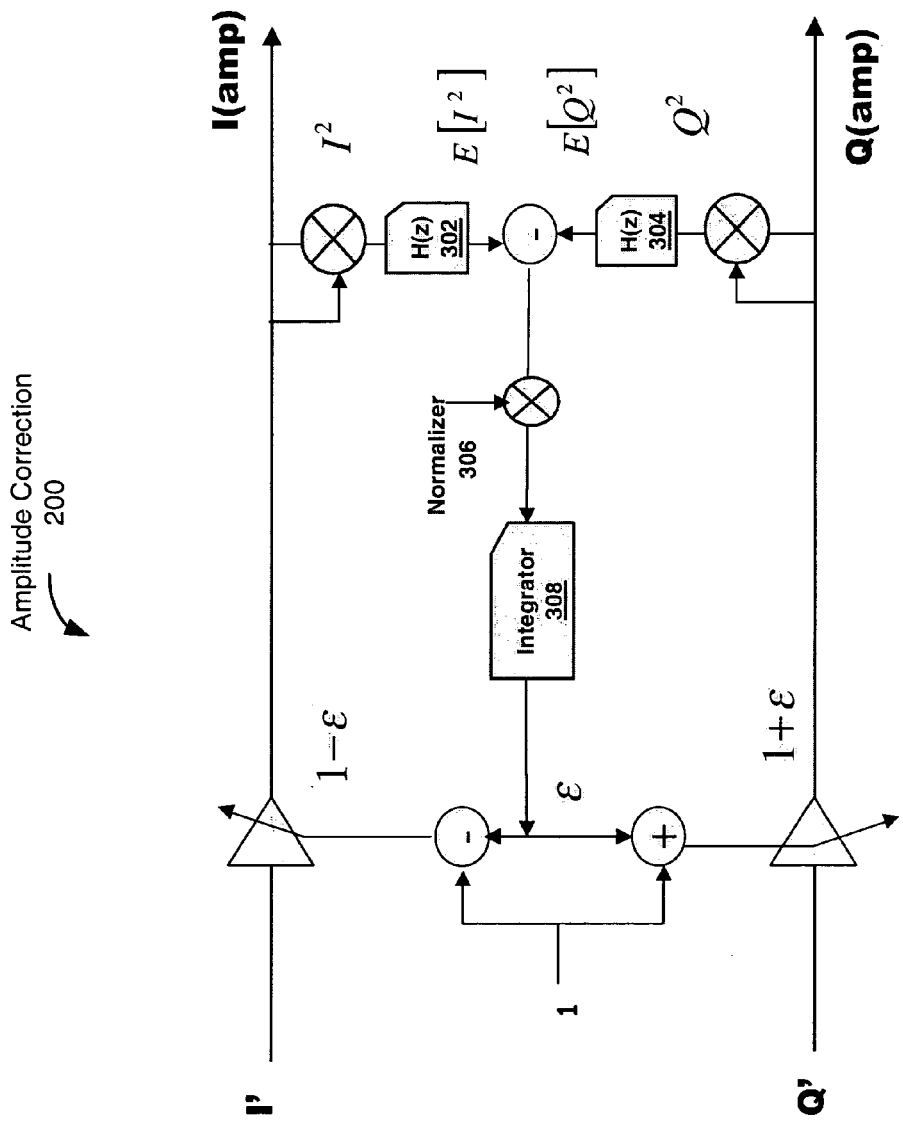
FIG. 3 is a block diagram illustrating an amplitude corrector according to an embodiment of the invention.

FIG. 3 illustrates the amplitude correction block 200 in greater detail according to one embodiment of the invention. The amplitude correction is an iterative feedback scheme for estimating and correcting the amplitude imbalance. At each iteration instance of n, the instantaneous values of I and Q are squared using one or more multipliers. One or more filters, such as 302 or 304, are used to filter the squared values to provide an approximation of the long term energy of each quadrature. In one embodiment, the filters are first order auto-regressive filters of the form:

$$H(z) = \frac{1-\alpha}{1-\alpha z^{-1}},$$

where $\alpha$ may represent constant values in a range of $\alpha \in [0.4:0.8]$. The filtered energies are then subtracted, and the difference of the energies is input into normalizer 306 to be normalized by a factor of $1/2E_S^2$ (where $E_S^2$ is the energy of the input signal). The normalization factor may be obtained from the AGC 110. The normalized difference is the energy error and is accumulated by integrator 308. In one embodiment, the integrator 308 is a first order integrator of the form:

$$G(z) = \frac{\beta}{1-z^{-1}},$$

where $\beta$ may represent constant values in the order $\beta \approx 2^{-14}$. The integrated error is the estimate of the amplitude imbalance, $\epsilon$. Two correction factors are then generated: $(1-\epsilon)$ and $(1+\epsilon)$. These correction factors are used to multiply the next samples of I and Q, respectively.

In one embodiment, an optimization of the number of bits may be used in the amplitude correction block 200. For example, suppose the I and Q components are 10 bits each. These 10 bit numbers may be represented as a fixed point number, S2.7 (one sign bit, two integer bits, and 7 fractional bits). After the I and Q components are squared and filtered, the result is a 19 bit number that may be represented as S4.14 (one sign bit, 4 integer bits, and 14 fractional bits). After normalization, the result is a 20 bit number. After integration, the resulting estimated amplitude imbalance, $\epsilon$, is a 32 bit number, which may be represented as S0.31 (one sign bit, no integer bits, and 31 fractional bits).

Figure 4:
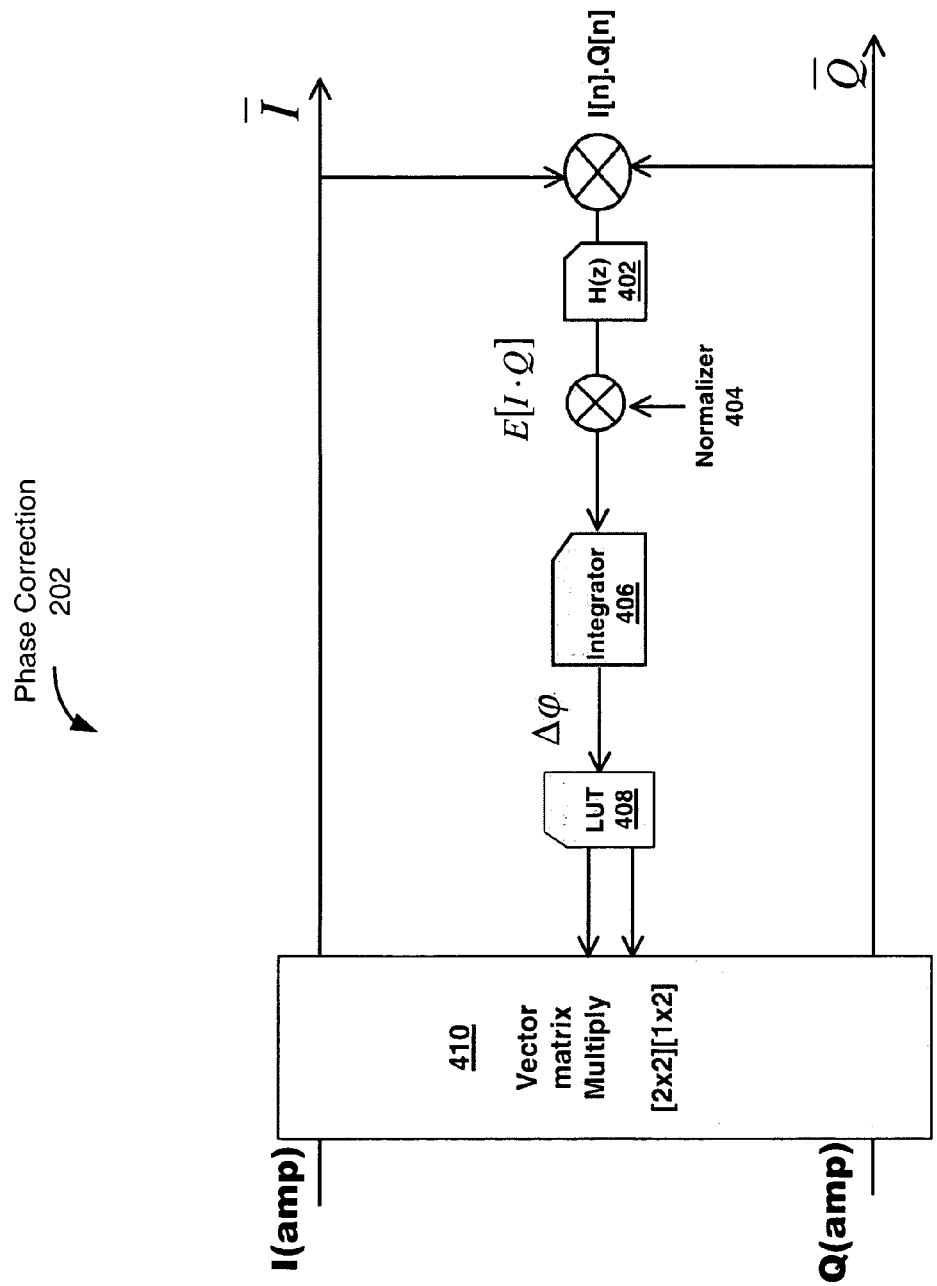
FIG. 4 is a block diagram illustrating a phase corrector according to an embodiment of the invention.

FIG. 4 illustrates the phase correction block 202 in greater detail according to one embodiment of the invention. The phase correction is an iterative feedback scheme for estimating and correcting the phase imbalance. At each iteration instance n, the quadrature values of I and Q are multiplied. This product is then filtered by filter 402. This filtered output approximates the statistical correlation of the two quadratures. In one embodiment, the filter 402 is a first order auto-regressive filter of the form:

$$H(z) = \frac{1-\alpha}{1-\alpha z^{-1}},$$

where $\alpha$ may represent constant values in a range of $\alpha \in [0.4:0.8]$. The filtered cross-correlation is then input into normalizer 404 to be normalized by a factor of $1/2E_S^2$. The normalization factor may be obtained from the AGC 110. The normalized cross-correlation is the phase error and is accumulated by integrator 406. In one embodiment, the integrator 406 is a first order integrator of the form:

$$G(z) = \frac{\beta}{1-z^{-1}},$$

where $\beta$ may represent constant values in the order $\beta \approx 2^{-14}$. The integrated error is the estimate of the phase imbalance, $\Delta\theta$. A correction vector matrix $[A]^{-1}$ is then generated:

$$A = \begin{bmatrix} \cos\left(\frac{\Delta\vartheta}{2}\right) & -\sin\left(\frac{\Delta\vartheta}{2}\right) \\ -\sin\left(\frac{\Delta\vartheta}{2}\right) & \cos\left(\frac{\Delta\vartheta}{2}\right) \end{bmatrix} \text{ and}$$

$$A^{-1} = \frac{1}{\cos(\Delta\vartheta)} \begin{bmatrix} \cos\left(\frac{\Delta\vartheta}{2}\right) & \sin\left(\frac{\Delta\vartheta}{2}\right) \\ \sin\left(\frac{\Delta\vartheta}{2}\right) & \cos\left(\frac{\Delta\vartheta}{2}\right) \end{bmatrix}.$$

In one embodiment, the correction matrix may be constructed using one or more lookup tables 408 used to generate the following two terms:

$$A_1 = \frac{\cos\left(\frac{\Delta\vartheta}{2}\right)}{\cos(\Delta\vartheta)} \text{ and } A_2 = \frac{\sin\left(\frac{\Delta\vartheta}{2}\right)}{\cos(\Delta\vartheta)}.$$

The correction matrix may then be constructed as:

$$A^{-1} = \begin{bmatrix} A_1 & A_2 \\ A_2 & A_1 \end{bmatrix}.$$

In an alternative embodiment, the two terms, $A_1$ and $A_2$, may be approximated using Taylor series as:

$$A_1 = \frac{\cos\left(\frac{\Delta\vartheta}{2}\right)}{\cos(\Delta\vartheta)} \approx 1 + \frac{3}{2}\left(\frac{\Delta\vartheta}{2}\right)^2 \text{ and}$$

-continued $$A_2 = \frac{\sin\left(\frac{\Delta\vartheta}{2}\right)}{\cos(\Delta\vartheta)} \approx \left(\frac{\Delta\vartheta}{2}\right) + \frac{11}{6}\left(\frac{\Delta\vartheta}{2}\right)^3.$$

Multipliers may be used to generate the approximated $A_1$ and $A_2$ terms. For example, a first multiplier may be used to generate the square $\Delta\theta$ and a second multiplier may be used to generate the cube of $\Delta\theta$.

After the matrix $[A]^{-1}$ is determined, the phase-corrected quadratures, $\bar{I}$ and $\bar{Q}$, are generated by a vector matrix multiply 410 as follows:

$$\begin{bmatrix} \bar{I} \\ \bar{Q} \end{bmatrix} = \begin{bmatrix} A_1 & A_2 \\ A_2 & A_1 \end{bmatrix} \cdot \begin{bmatrix} I(\text{amp}) \\ Q(\text{amp}) \end{bmatrix}.$$

In one embodiment, an optimization of the number of bits may be used in the phase correction block 202. For example, suppose the I and Q components are 10 bits each. These 10 bit numbers may be represented as a fixed point number, S2.7 (one sign bit, two integer bits, and 7 fractional bits). After the I and Q components are multiplied and filtered, the result is a 19 bit number that may be represented as S4.14 (one sign bit, 4 integer bits, and 14 fractional bits). After normalization and integration, the resulting estimated phase imbalance, $\Delta\theta$, is a 16 bit number, which may be represented as S0.15 (one sign bit, no integer bits, and 15 fractional bits).

Figure 5:
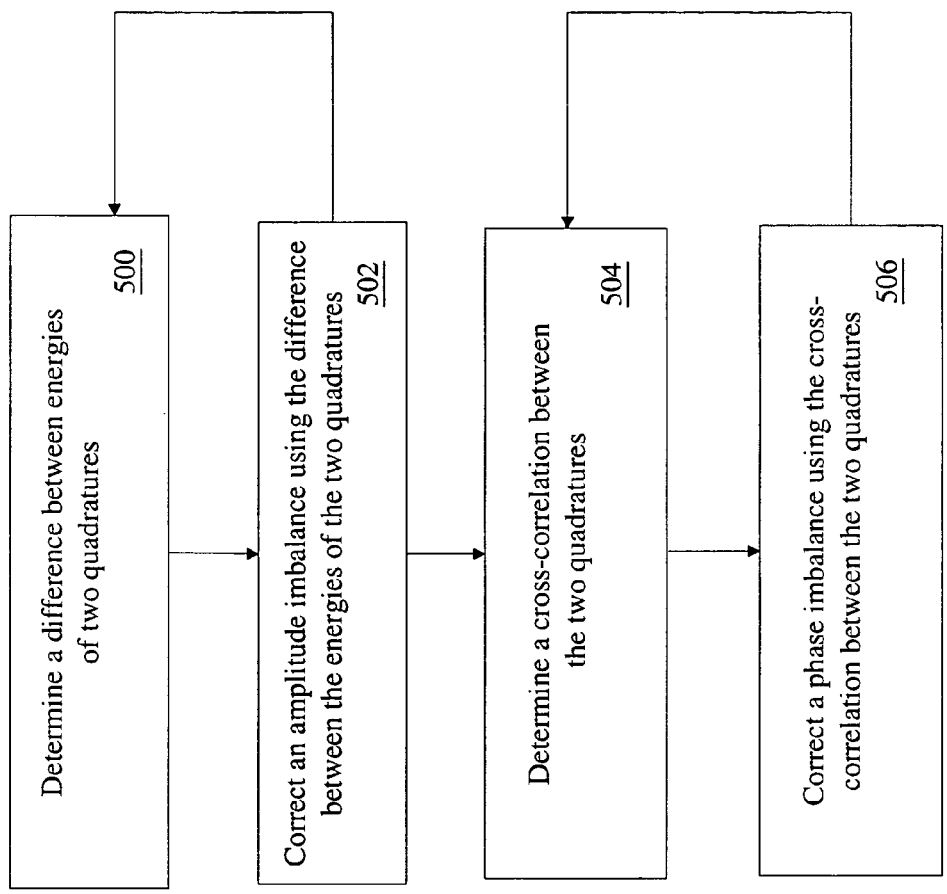
FIG. 5 is a flow diagram illustrating a method according to an embodiment of the invention.

FIG. 5 illustrates a method according to one embodiment of the invention. At 500, a difference between the energies of two baseband quadratures is determined. In one embodiment, the two quadratures comprise I and Q components. In one embodiment, the energies of the two quadratures are sampled and the method is performed iteratively. In one embodiment, the instantaneous energies of the two quadratures are determined by squaring the instantaneous values. The energies may then be filtered. The filtered energies may then be subtracted. At 502, amplitude imbalance is corrected using the difference between the energies of the two quadratures. In one embodiment, the energy difference is normalized. This normalized difference may then be accumulated by an integrator to estimate the amplitude imbalance. Correction factors may then be computed based on the estimated amplitude imbalance, such as one plus the estimated amplitude imbalance and one minus the estimated amplitude imbalance. The next samples of the two quadratures may then be multiplied by the correction factors. For example, the I component may be multiplied by one minus the estimated amplitude imbalance and the Q component may be multiplied by one plus the estimated amplitude imbalance.

At 504, a cross-correlation between the two quadratures is determined. The cross-correlation may be determined by multiplying the instantaneous values of the two quadratures. At 506, phase imbalance is corrected using the cross-correlation between the two quadratures. In one embodiment, the cross-correlation may be filtered and then normalized. The normalized cross-correlation may then be accumulated by an integrator to estimate the phase imbalance. A correction matrix may then be constructed using the estimated phase imbalance. The correction matrix may then be multiplied by the two quadratures to correct the phase imbalance.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   determining a difference between energies of two baseband quadratures by squaring instantaneous values of the two quadratures, filtering the squared instantaneous values of the two quadratures, and subtracting the filtered energies of the two quadratures;
   correcting an amplitude imbalance using the difference between the energies of the two quadratures by normalizing the difference between filtered energies of two quadratures, accumulating the normalized difference between filtered energies of two quadratures using an integrator to estimate the amplitude imbalance, and computing correction factors using the estimated amplitude imbalance, wherein the correction factors are one minus the estimated amplitude imbalance and one plus the estimated amplitude imbalance;
   determining a cross-correlation between the two quadratures; and
   correcting a phase imbalance using the cross-correlation between the two quadratures.

2. The method of claim 1, further comprising sampling the values of the two quadratures and performing the method iteratively.

3. The method of claim 2, further comprising multiplying samples of the two quadratures by the correction factors.

4. The method of claim 3, wherein the two quadratures comprise baseband I and Q components.

5. The method of claim 4, wherein multiplying samples of the two quadratures by the correction factors comprises multiplying the I component by one minus the estimated amplitude imbalance.

6. The method of claim 5, wherein multiplying samples of the energies of the two quadratures by the correction factors comprises multiplying the Q component by one plus the estimated amplitude imbalance.

7. The method of claim 1, wherein correcting the phase imbalance comprises filtering the cross-correlation between instantaneous values of the two quadratures.

8. The method of claim 7, wherein correcting the phase imbalance further comprises normalizing the filtered cross-correlation.

9. The method of claim 8, wherein correcting the phase imbalance further comprises integrating the normalized cross-correlation to estimate the phase imbalance.

10. The method of claim 1, wherein correcting the phase imbalance using the cross-correlation is performed after correcting the amplitude imbalance.

* * * * *